United States Patent
Kato

(10) Patent No.: US 9,023,740 B2
(45) Date of Patent: May 5, 2015

(54) HEAT TREATMENT METHOD AND HEAT TREATMENT APPARATUS FOR HEATING SUBSTRATE BY IRRADIATING SUBSTRATE WITH LIGHT

(71) Applicant: Dainippon Screen Mfg. Co., Ltd., Kyoto (JP)

(72) Inventor: Shinichi Kato, Kyoto (JP)

(73) Assignee: Screen Holdings Co., Ltd. (JP)

( * ) Notice: Subject to any disclaimer, the term of this patent is extended or adjusted under 35 U.S.C. 154(b) by 0 days.

(21) Appl. No.: 13/914,698

(22) Filed: Jun. 11, 2013

(65) Prior Publication Data

US 2013/0337661 A1    Dec. 19, 2013

(30) Foreign Application Priority Data

Jun. 15, 2012 (JP) .............................. JP2012-135417

(51) Int. Cl.
*H01L 21/26* (2006.01)
*H01L 21/324* (2006.01)
(Continued)

(52) U.S. Cl.
CPC .......... *H01L 21/26* (2013.01); *H01L 21/67115* (2013.01); *H01L 21/02356* (2013.01); *H01L 21/28176* (2013.01); *H01L 21/2636* (2013.01); (Continued)

(58) Field of Classification Search
CPC . H01L 21/26; H01L 21/2636; H01L 21/2686; H01L 21/02356; H01L 21/67115; H01L 21/28185; H01L 21/28176
USPC ........ 438/778, 795; 392/411, 416; 427/372.2, 427/379, 380
See application file for complete search history.

(56) References Cited

U.S. PATENT DOCUMENTS 5,665,210 A * 9/1997 Yamazaki .......................... 438/3
5,739,549 A * 4/1998 Takemura et al. .............. 257/59
(Continued)

FOREIGN PATENT DOCUMENTS

JP    2001-044387    2/2001
JP    2002-329668    11/2002
(Continued)

OTHER PUBLICATIONS

Office Action issued by Korean Patent Office on Apr. 8, 2014 in connection with corresponding Korean Patent Application No. 10-2013-0066463 with Japanese and English Translations thereof.
(Continued)

*Primary Examiner* — Mary Wilczewski
(74) *Attorney, Agent, or Firm* — Ostrolenk Faber LLP

(57) ABSTRACT

A surface of a semiconductor wafer with a gate of a high dielectric constant film formed thereon is heated to a target temperature for a short time by irradiating the surface with a flash of light. This promotes the crystallization of the high dielectric constant film while suppressing the growth of an underlying silicon dioxide film. Subsequently, the temperature of the semiconductor wafer subjected to the flash heating is maintained at an annealing temperature by irradiating the semiconductor wafer with light from halogen lamps. An annealing process after the flash heating is performed in an atmosphere of a gas mixture of hydrogen gas and nitrogen gas. The annealing process is performed on the semiconductor wafer in the atmosphere of the hydrogen-nitrogen gas mixture, so that defects present near the interfaces of the high dielectric constant film are eliminated by hydrogen termination.

6 Claims, 13 Drawing Sheets

(51) Int. Cl.
*H01L 21/67* (2006.01)
*H01L 21/02* (2006.01)
*H01L 21/28* (2006.01)
*H01L 21/263* (2006.01)
*H01L 21/687* (2006.01)
*H01L 21/268* (2006.01)
*H01L 29/51* (2006.01)

(52) U.S. Cl.
CPC ...... *H01L 21/68785* (2013.01); *H01L 21/2686* (2013.01); *H01L 21/28185* (2013.01); *H01L 29/517* (2013.01)

(56) References Cited

U.S. PATENT DOCUMENTS

| | | | | |
|---|---|---|---|---|
| 5,910,218 | A * | 6/1999 | Park et al. | 118/719 |
| 6,849,831 | B2 * | 2/2005 | Timans et al. | 219/390 |
| 6,951,996 | B2 * | 10/2005 | Timans et al. | 219/390 |
| 7,084,068 | B2 * | 8/2006 | Suguro et al. | 438/708 |
| 7,101,753 | B2 * | 9/2006 | Kamiyama et al. | 438/240 |
| 7,317,870 | B2 * | 1/2008 | Timans et al. | 392/416 |
| 7,989,283 | B2 | 8/2011 | Yamanari et al. | 438/199 |
| 8,000,584 | B1 * | 8/2011 | Goodman et al. | 386/335 |
| 8,623,750 | B2 * | 1/2014 | Fuse et al. | 438/591 |
| 8,809,175 | B2 * | 8/2014 | Tsai et al. | 438/591 |
| 8,837,923 | B2 * | 9/2014 | Timans et al. | 392/411 |
| 8,852,966 | B2 * | 10/2014 | Kiyama et al. | 438/14 |
| 2002/0127827 | A1 | 9/2002 | Yamazaki et al. | |
| 2003/0031793 | A1 * | 2/2003 | Chang et al. | 427/255.28 |
| 2003/0082909 | A1 * | 5/2003 | Li et al. | 438/680 |
| 2003/0183612 | A1 * | 10/2003 | Timans et al. | 219/390 |
| 2004/0149715 | A1 * | 8/2004 | Timans et al. | 219/390 |
| 2004/0224486 | A1 | 11/2004 | Ichijo et al. | |
| 2004/0266214 | A1 * | 12/2004 | Suguro et al. | 438/771 |
| 2005/0158930 | A1 | 7/2005 | Yamazaki et al. | |
| 2005/0236395 | A1 * | 10/2005 | Timans et al. | 219/497 |
| 2006/0110531 | A1 * | 5/2006 | Chang et al. | 427/248.1 |
| 2006/0273408 | A1 * | 12/2006 | Kamiyama et al. | 257/401 |
| 2008/0069550 | A1 * | 3/2008 | Timans et al. | 392/411 |
| 2009/0067823 | A1 * | 3/2009 | Kusuda | 392/418 |
| 2009/0209095 | A1 * | 8/2009 | Horii | 438/585 |
| 2009/0285568 | A1 * | 11/2009 | Kiyama et al. | 392/418 |
| 2011/0236844 | A1 * | 9/2011 | Timans et al. | 432/49 |
| 2012/0008926 | A1 * | 1/2012 | Kusuda | 392/418 |
| 2012/0171795 | A1 | 7/2012 | Yamazaki et al. | |
| 2012/0244725 | A1 * | 9/2012 | Fuse et al. | 438/799 |
| 2013/0072030 | A1 * | 3/2013 | Wang et al. | 438/785 |
| 2013/0078786 | A1 * | 3/2013 | Fuse et al. | 438/478 |
| 2013/0203269 | A1 * | 8/2013 | Yokouchi | 438/795 |
| 2013/0337661 | A1 * | 12/2013 | Kato | 438/795 |
| 2014/0242808 | A1 * | 8/2014 | Akiyama et al. | 438/763 |
| 2014/0335685 | A1 * | 11/2014 | Tsai et al. | 438/591 |

FOREIGN PATENT DOCUMENTS

| | | | |
|---|---|---|---|
| JP | 2003-173970 | 6/2003 | |
| JP | 2012-104808 | 5/2012 | |
| KR | 20130141376 | * 12/2013 | H01L 21/26 |

OTHER PUBLICATIONS

Decision to Grant issued by Korean Patent Office on Dec. 12, 2014 in connection with corresponding Korean Patent Application No. 10-2013-0066463.

* cited by examiner

F I G . 2
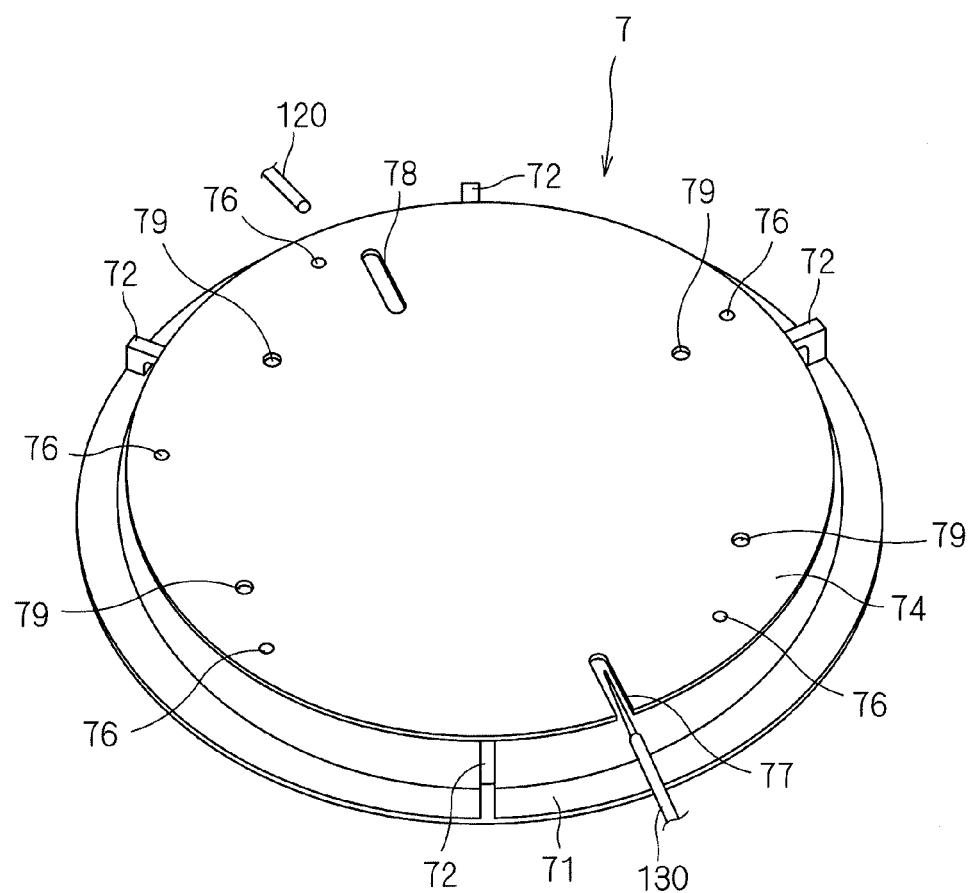

F I G. 4
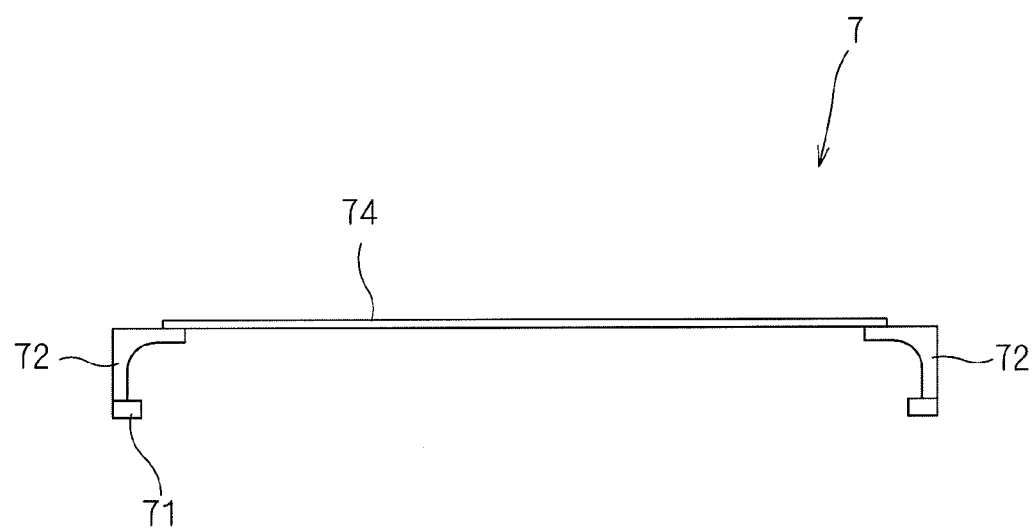

F I G. 5
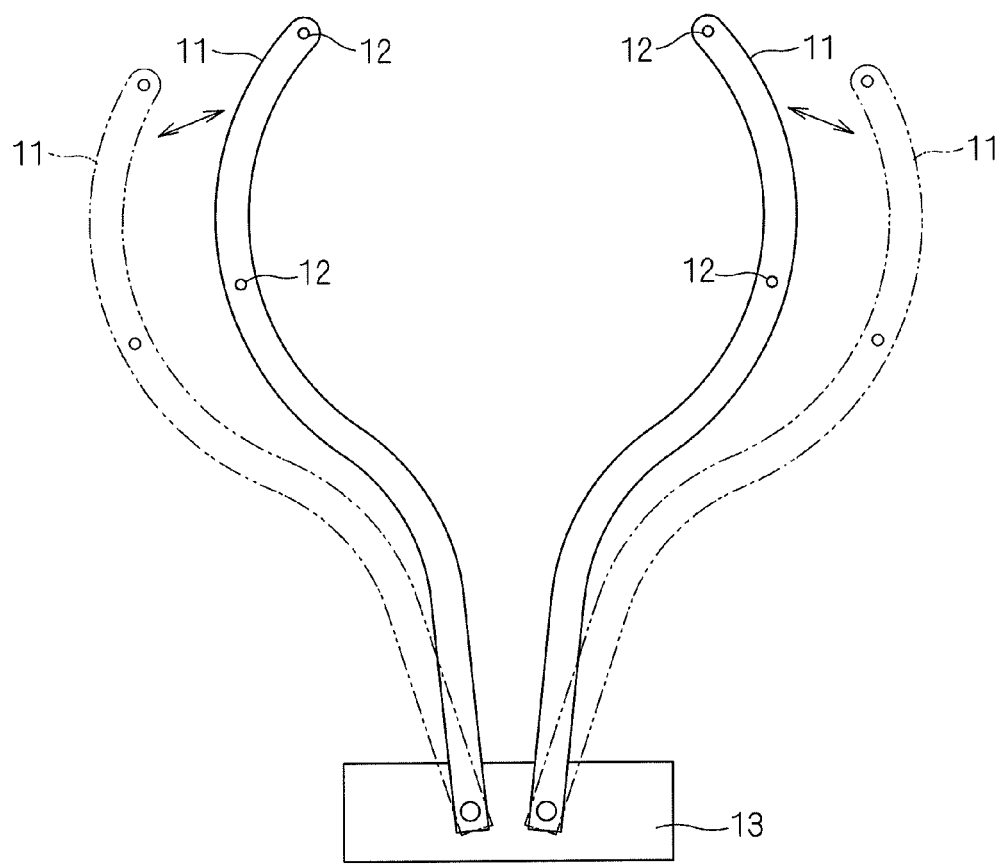

F I G. 6
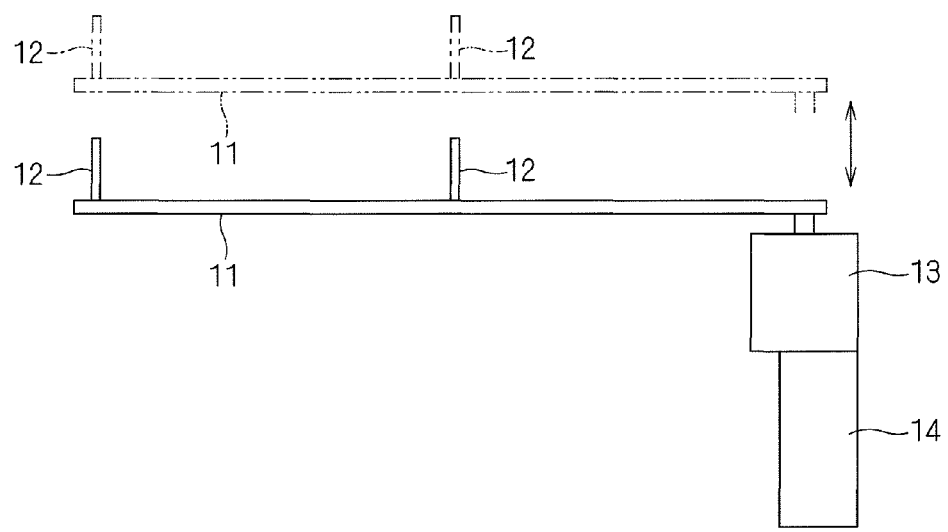

F I G . 7
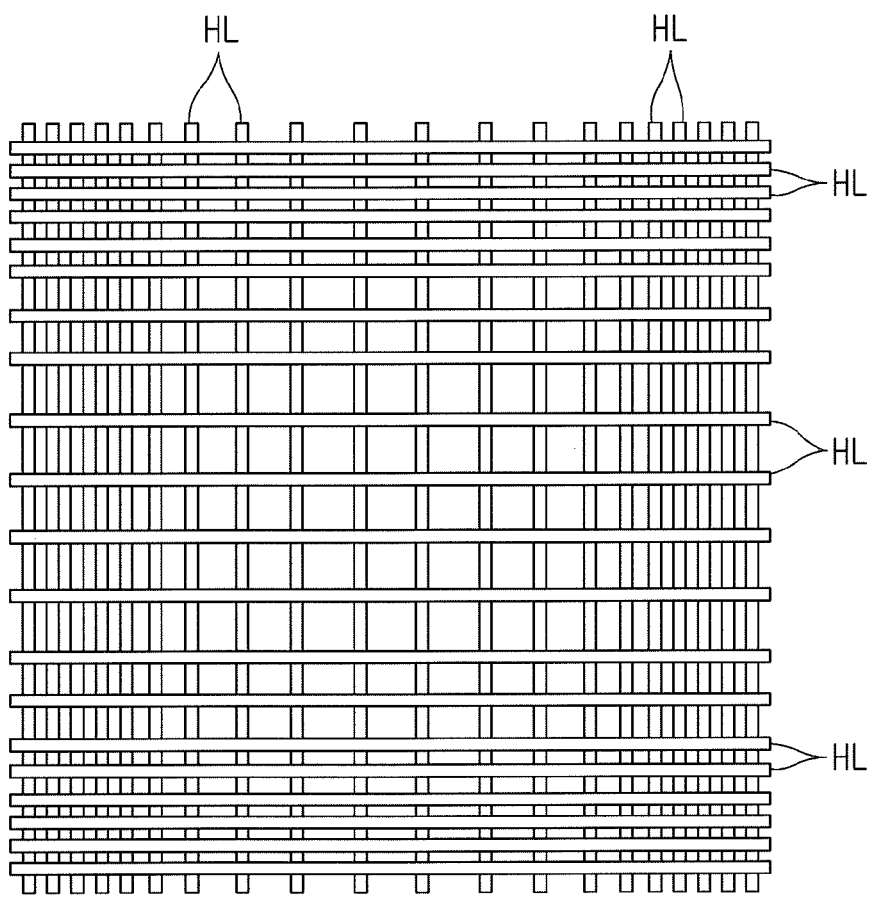

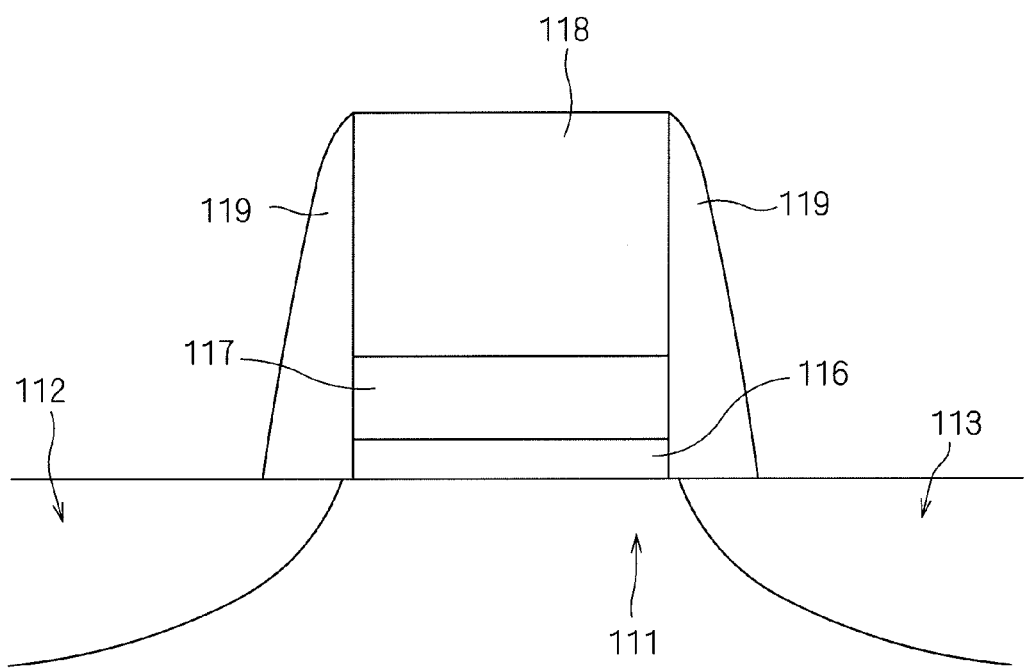

F I G. 1 1
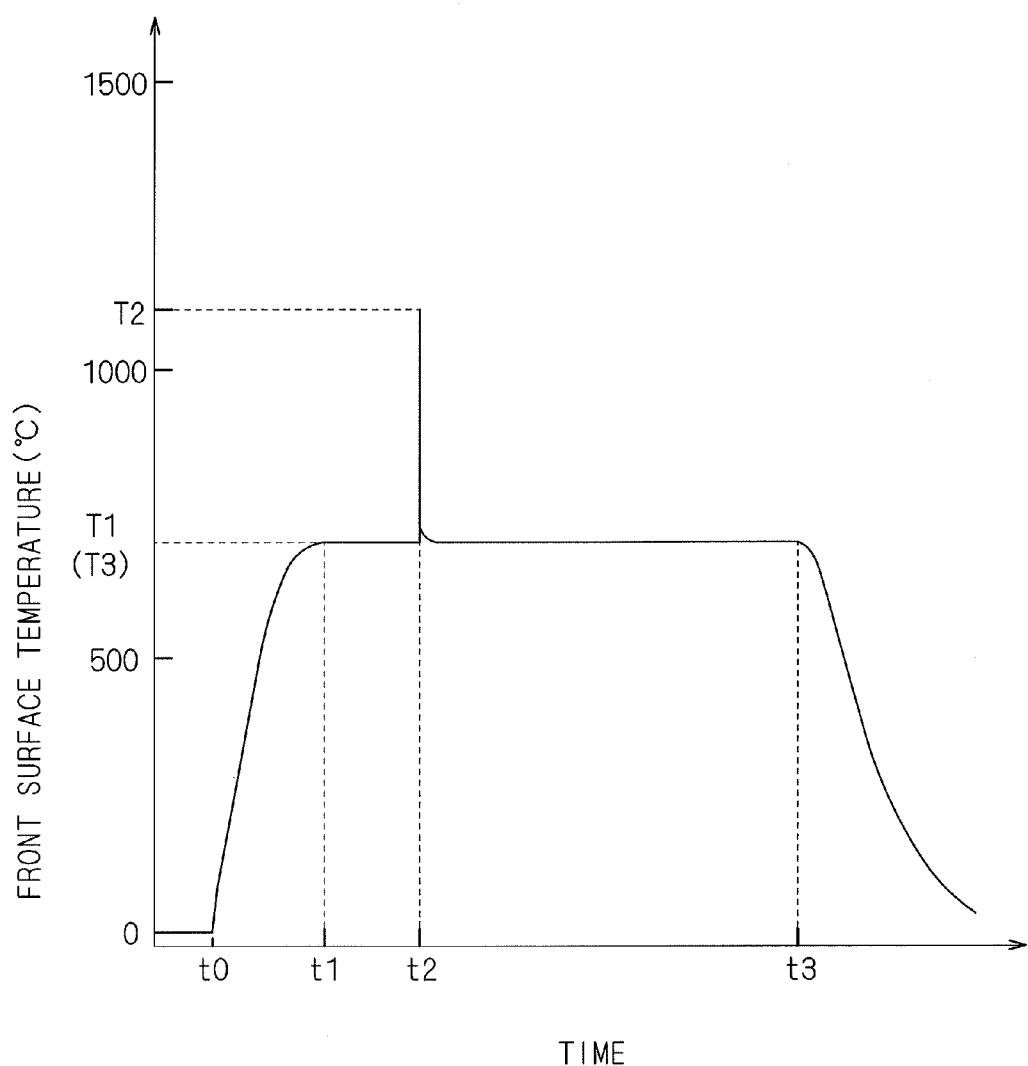

F I G. 1 2
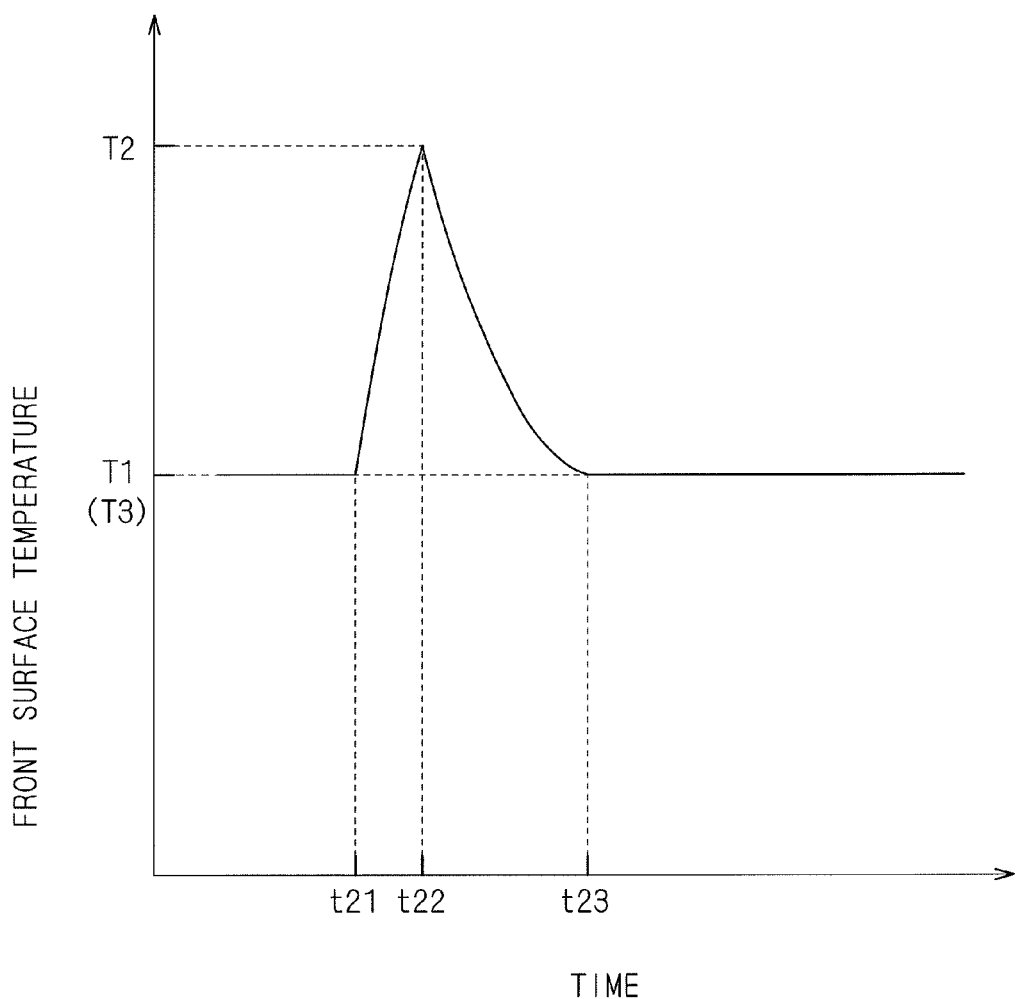

F I G . 1 3
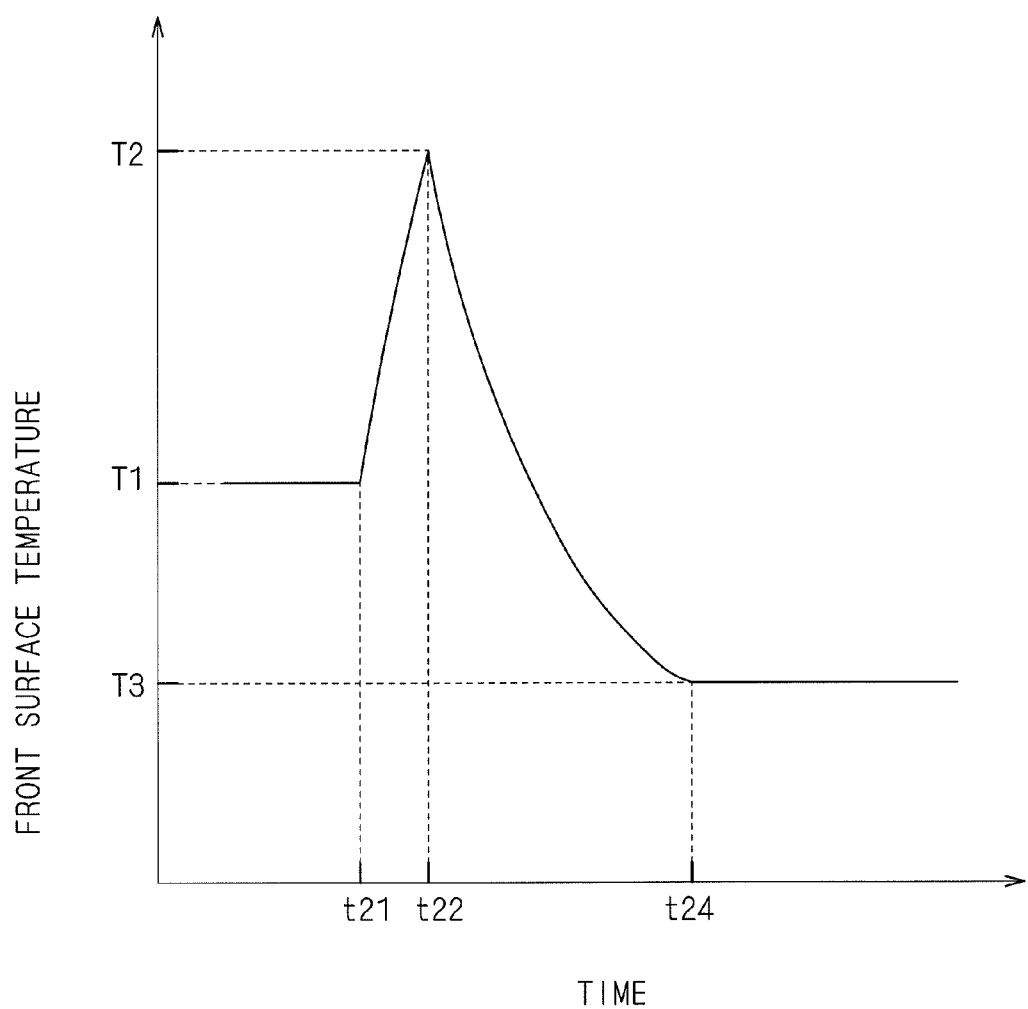

HEAT TREATMENT METHOD AND HEAT TREATMENT APPARATUS FOR HEATING SUBSTRATE BY IRRADIATING SUBSTRATE WITH LIGHT

BACKGROUND OF THE INVENTION

1. Field of the Invention

The present invention relates to a heat treatment method and a heat treatment apparatus for heating a substrate such as a semiconductor wafer with a high dielectric constant film formed thereon by irradiating the substrate with light, thereby promoting the crystallization of the high dielectric constant film.

2. Description of the Background Art

Hitherto, silicon dioxide ($SiO_2$) has been typically used as the material of a gate insulator film for a field-effect transistor (FET). However, as gate insulator films are made thinner with the decreasing size of devices, the increase in leakage current has become a problem. To solve the problem, a metal gate electrode such that metal is used as the material of a gate electrode has been developed while a material (a high dielectric constant material or a high-k material) having a relative dielectric constant higher than that of silicon dioxide is used as the material of a gate insulator film, as disclosed in U.S. Pat. No. 7,989,283.

However, a problem to be described below arises during the heat treatment of a semiconductor wafer on which a high dielectric constant film (a high-k film) is formed as the gate insulator film. The high dielectric constant film is formed by depositing a high dielectric constant material, using a MOCVD (metal organic chemical vapor deposition) technique and the like. In recent years, attention has also been given to an ALD (atomic layer deposition) technique in which atomic layers are deposited one by one. In either technique, the high dielectric constant film just deposited without any post processing is low in crystallinity. It is hence necessary to anneal the high dielectric constant film at 1000° C. or higher, thereby promoting the crystallization of the high dielectric constant film.

The heating of the high dielectric constant film to 1000° C. or higher over a prolonged period of time of several seconds or more, however, gives rise to a problem such that the movement of oxygen grows a film of silicon dioxide present between the high dielectric constant film and silicon serving as a base material to increase the thickness of the film of silicon dioxide, thereby lowering device characteristics.

Additionally, interfaces between the deposited high dielectric constant film and the underlying silicon dioxide film and between the deposited high dielectric constant film and a metal gate electrode to be formed thereover are inevitably lower in quality as compared with an interface between silicon and silicon dioxide. It is hence required to improve the interface characteristics of the high dielectric constant film when the high dielectric constant film is used as the gate insulator film.

SUMMARY OF THE INVENTION

The present invention is intended for a method of irradiating a substrate with a high dielectric constant film formed thereon with light to heat the substrate, thereby promoting the crystallization of the high dielectric constant film.

According to an aspect of the present invention, the method comprises the steps of: (a) irradiating a surface of the substrate with the high dielectric constant film formed thereon with a flash of light from a flash lamp to heat the surface of the substrate including the high dielectric constant film to a first temperature; and (b) irradiating the substrate with light from a halogen lamp to maintain the temperature of the substrate at a second temperature lower than the first temperature, the step (b) being performed in an atmosphere containing any gas selected from the group consisting of hydrogen, ammonia, hydrogen chloride, sulfur dioxide, nitrous oxide, and hydrogen sulfide.

While the crystallization of the high dielectric constant film is promoted by the flash heating, the annealing process using the halogen lamp is performed in an atmosphere gas. Thus, this method also improves the interface characteristics of the high dielectric constant film.

The present invention is also intended for a heat treatment apparatus for irradiating a substrate with a high dielectric constant film formed thereon with light to heat the substrate, thereby promoting the crystallization of the high dielectric constant film.

According to an aspect of the present invention, the heat treatment apparatus comprises: a chamber for receiving therein the substrate with the high dielectric constant film formed thereon; a holder for holding the substrate in the chamber; a flash lamp for irradiating a surface of the substrate held by the holder with a flash of light to heat the surface of the substrate including the high dielectric constant film to a first temperature; a halogen lamp for irradiating the substrate held by the holder with light; an atmosphere forming part for supplying any gas selected from the group consisting of hydrogen, ammonia, hydrogen chloride, sulfur dioxide, nitrous oxide, and hydrogen sulfide into the chamber to form an atmosphere containing the gas within the chamber; and a controller for controlling the emission of light from the halogen lamp and the atmosphere forming part so as to irradiate the substrate with light from the halogen light, thereby maintaining the temperature of the substrate at a second temperature lower than the first temperature, while forming an atmosphere containing the gas within the chamber.

While the crystallization of the high dielectric constant film is promoted by the flash heating, the annealing process using the halogen lamp is performed in an atmosphere gas. Thus, this heat treatment apparatus also improves the interface characteristics of the high dielectric constant film.

It is therefore an object of the present invention to improve the interface characteristics of a high dielectric constant film while promoting the crystallization of the high dielectric constant film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a perspective view showing the entire external appearance of a holder;

FIG. 4 is a side view of the holder as seen from one side;

FIG. 5 is a plan view of a transfer mechanism;

FIG. 6 is a side view of the transfer mechanism;

FIG. 7 is a plan view showing an arrangement of halogen lamps;

FIG. 10 is a view schematically showing a gate structure including a high dielectric constant film used as a gate insulator film;

FIG. 11 a graph showing changes in the temperature of the front surface of a semiconductor wafer;

FIG. 12 is a graph showing changes in the temperature of the front surface of a semiconductor wafer before and after a flash heating treatment; and FIG. 13 is a graph showing another example of changes in the temperature of the front surface of a semiconductor wafer before and after the flash heating treatment.

DESCRIPTION OF THE PREFERRED EMBODIMENTS

A preferred embodiment according to the present invention will now be described in detail with reference to the drawings.

Figure 1:
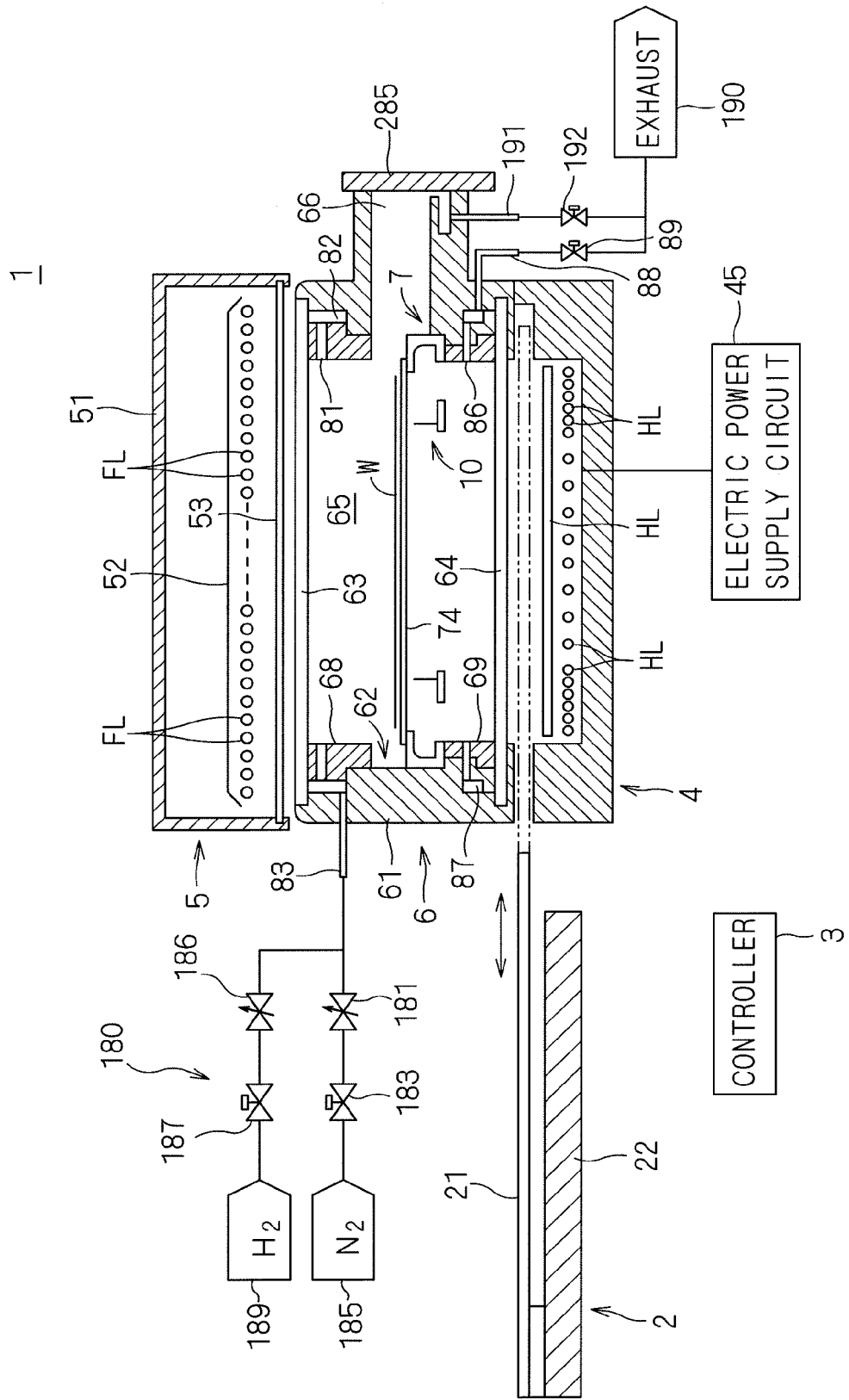
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 according to the present preferred embodiment is a flash lamp annealer for irradiating a disk-shaped semiconductor wafer W having a diameter of 300 mm and serving as a substrate with a flash of light to heat the semiconductor wafer W. A gate of a high dielectric constant film is formed on a semiconductor wafer W prior to the transport into the heat treatment apparatus 1, and the heat treatment apparatus 1 performs a heating treatment on the semiconductor wafer W to thereby promote the crystallization of the high dielectric constant film, which will be described in detail later.

The heat treatment apparatus 1 includes a chamber 6 for receiving a semiconductor wafer W therein, a flash heating part 5 including a plurality of built-in flash lamps FL, a halogen heating part 4 including a plurality of built-in halogen lamps HL, and a shutter mechanism 2. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes an atmosphere forming mechanism 180 for forming an atmosphere of a forming gas (a hydrogen-nitrogen gas mixture) inside the chamber 6. The heat treatment apparatus 1 further includes a controller 3 for controlling operating mechanisms provided in the shutter mechanism 2, the atmosphere forming mechanism 180, the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits a flash of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W.

The chamber side portion 61, and the upper and lower reflective rings 68 and 69 are made of a metal material (e.g., stainless steel) with high strength and high heat resistance. The inner peripheral surfaces of the upper and lower reflective rings 68 and 69 are provided as mirror surfaces by electrolytic nickel plating.

The chamber side portion 61 is provided with a transport opening (throat) 66 for the transport of a semiconductor wafer W therethrough into and out of the chamber 6. The transport opening 66 is openable and closable by a gate valve 285. The transport opening 66 is connected in communication with an outer peripheral surface of the recessed portion 62. Thus, when the transport opening 66 is opened by the gate valve 285, a semiconductor wafer W is allowed to be transported through the transport opening 66 and the recessed portion 62 into and out of the heat treatment space 65. When the transport opening 66 is closed by the gate valve 285, the heat treatment space 65 in the chamber 6 is an enclosed space.

At least one gas supply opening 81 for supplying a predetermined gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is divided into two branch pipes. One of the two branch pipes is connected to a nitrogen gas supply source 185, and the other is connected to a hydrogen gas supply source 189. A valve 183 and a flow regulating valve 181 are inserted in the branch pipe connected to the nitrogen gas supply source 185, and a valve 187 and a flow regulating valve 186 are inserted in the branch pipe connected to the hydrogen gas supply source 189.

When the valve 183 is opened, nitrogen gas ($N_2$) is fed from the nitrogen gas supply source 185 through the gas supply pipe 83 to the buffer space 82. The flow rate of nitrogen gas flowing through the gas supply pipe 83 is regulated by the flow regulating valve 181. Also, when the valve 187 is opened, hydrogen gas ($H_2$) is fed from the hydrogen gas supply source 189 through the gas supply pipe 83 to the buffer space 82. The flow rate of hydrogen gas flowing through the gas supply pipe 83 is regulated by the flow regulating valve 186. The gas flowing in the buffer space 82 flows in a spreading manner within the buffer space 82 which is lower in fluid resistance than the gas supply opening 81, and is supplied through the gas supply opening 81 into the heat treatment space 65.

The atmosphere forming mechanism 180 includes the nitrogen gas supply source 185, the valve 183, the flow regulating valve 181, the hydrogen gas supply source 189, the valve 187, the flow regulating valve 186, the gas supply pipe 83, the buffer space 82, and the gas supply opening 81. By opening both the valve 183 and the valve 187, a gas mixture (forming gas) of hydrogen gas and nitrogen gas is supplied into the heat treatment space 65 to form an atmosphere of the forming gas in the heat treatment space 65.

On the other hand, at least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 3:
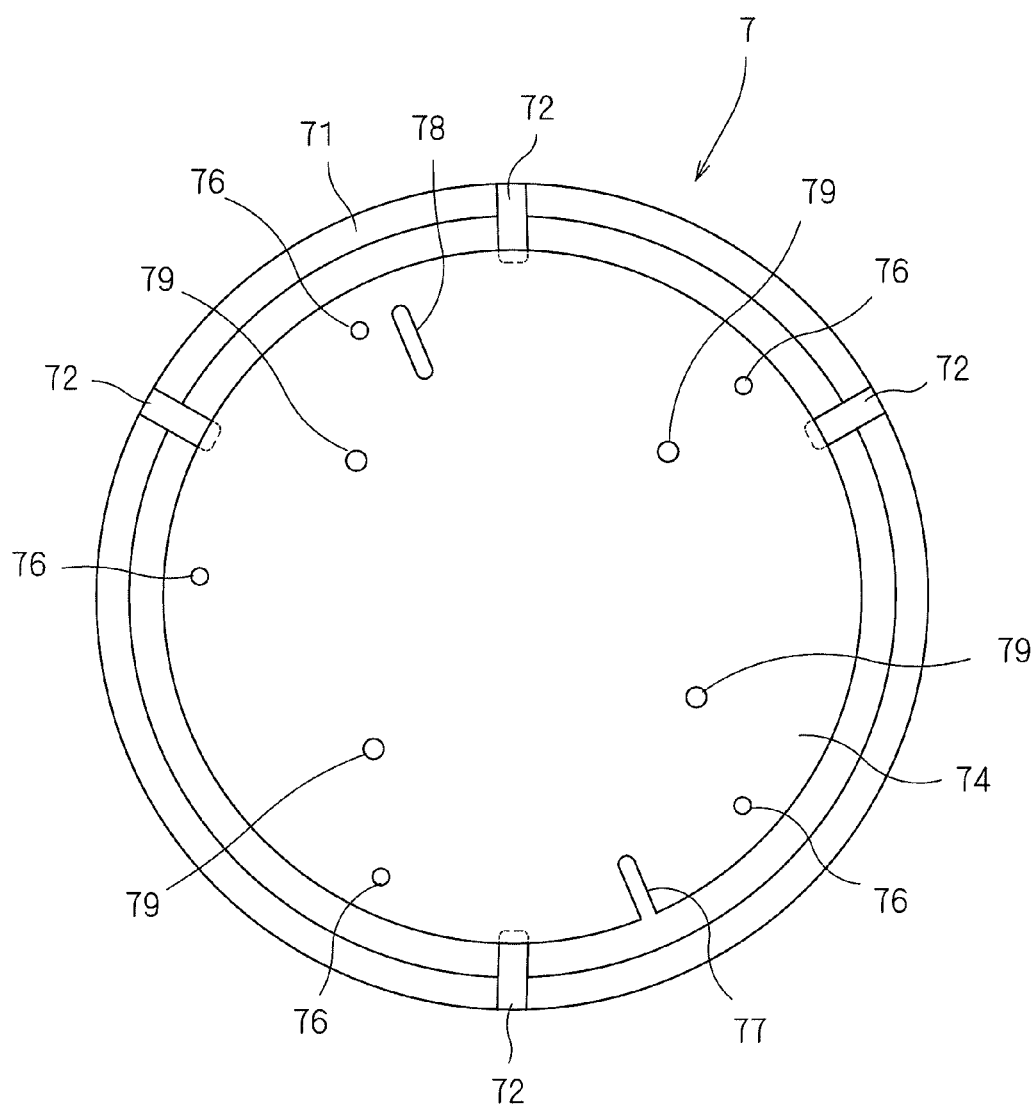
FIG. 3 is a top plan view of the holder.

FIG. 2 is a perspective view showing the entire external appearance of the holder 7. FIG. 3 is a top plan view of the holder 7. FIG. 4 is a side view of the holder 7 as seen from one side. The holder 7 includes a base ring 71, coupling portions 72, and a susceptor 74. The base ring 71, the coupling portions 72, and the susceptor 74 are all made of quartz. In other words, the whole of the holder 7 is made of quartz.

The base ring 71 is a quartz member in the form of an annular ring. The base ring 71 is supported by the wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 in the form of the annular ring and arranged in a circumferential direction of the base ring 71. The coupling portions 72 are quartz members, and are rigidly secured to the base ring 71 by welding. The base ring 71 may be of an arcuate shape such that a portion is removed from the annular ring.

The susceptor 74 having a planar shape is supported by the four coupling portions 72 provided on the base ring 71. The susceptor 74 is a generally circular planar member made of quartz. The diameter of the susceptor 74 is greater than that of a semiconductor wafer W. In other words, the susceptor 74 has a size, as seen in plan view, greater than that of the semiconductor wafer W. Multiple (in the present preferred embodiment, five) guide pins 76 are mounted upright on the upper surface of the susceptor 74. The five guide pins 76 are disposed along the circumference of a circle concentric with the outer circumference of the susceptor 74. The diameter of a circle on which the five guide pins 76 are disposed is slightly greater than the diameter of the semiconductor wafer W. The guide pins 76 are also made of quartz. The guide pins 76 may be machined from a quartz ingot integrally with the susceptor 74. Alternatively, the guide pins 76 separately machined may be attached to the susceptor 74 by welding and the like.

The four coupling portions 72 provided upright on the base ring 71 and the lower surface of a peripheral portion of the susceptor 74 are rigidly secured to each other by welding. In other words, the susceptor 74 and the base ring 71 are fixedly coupled to each other with the coupling portions 72, and the holder 7 is an integrally formed member made of quartz. The base ring 71 of such a holder 7 is supported by the wall surface of the chamber 6, whereby the holder 7 is mounted to the chamber 6. With the holder 7 mounted to the chamber 6, the susceptor 74 of a generally disc-shaped configuration assumes a horizontal attitude (an attitude such that the normal to the susceptor 74 coincides with a vertical direction). A semiconductor wafer W transported into the chamber 6 is placed and held in a horizontal attitude on the susceptor 74 of the holder 7 mounted to the chamber 6. The semiconductor wafer W is placed inside the circle defined by the five guide pins 76. This prevents the horizontal misregistration of the semiconductor wafer W. The number of guide pins 76 is not limited to five, but may be determined so as to prevent the misregistration of the semiconductor wafer W.

As shown in FIGS. 2 and 3, an opening 78 and a notch 77 are provided in the susceptor 74 so as to extend vertically through the susceptor 74. The notch 77 is provided to allow a distal end portion of a probe of a contact-type thermometer 130 including a thermocouple to pass therethrough. The opening 78, on the other hand, is provided for a radiation thermometer 120 to receive radiation (infrared radiation) emitted from the lower surface of the semiconductor wafer W held by the susceptor 74. The susceptor 74 further includes four through holes 79 bored therein and designed so that lift pins 12 of the transfer mechanism 10 to be described later pass through the through holes 79, respectively, to transfer a semiconductor wafer W.

FIG. 5 is a plan view of the transfer mechanism 10. FIG. 6 is a side view of the transfer mechanism 10. The transfer mechanism 10 includes a pair of transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct a flash of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is also a horizontal plane.

Figure 8:
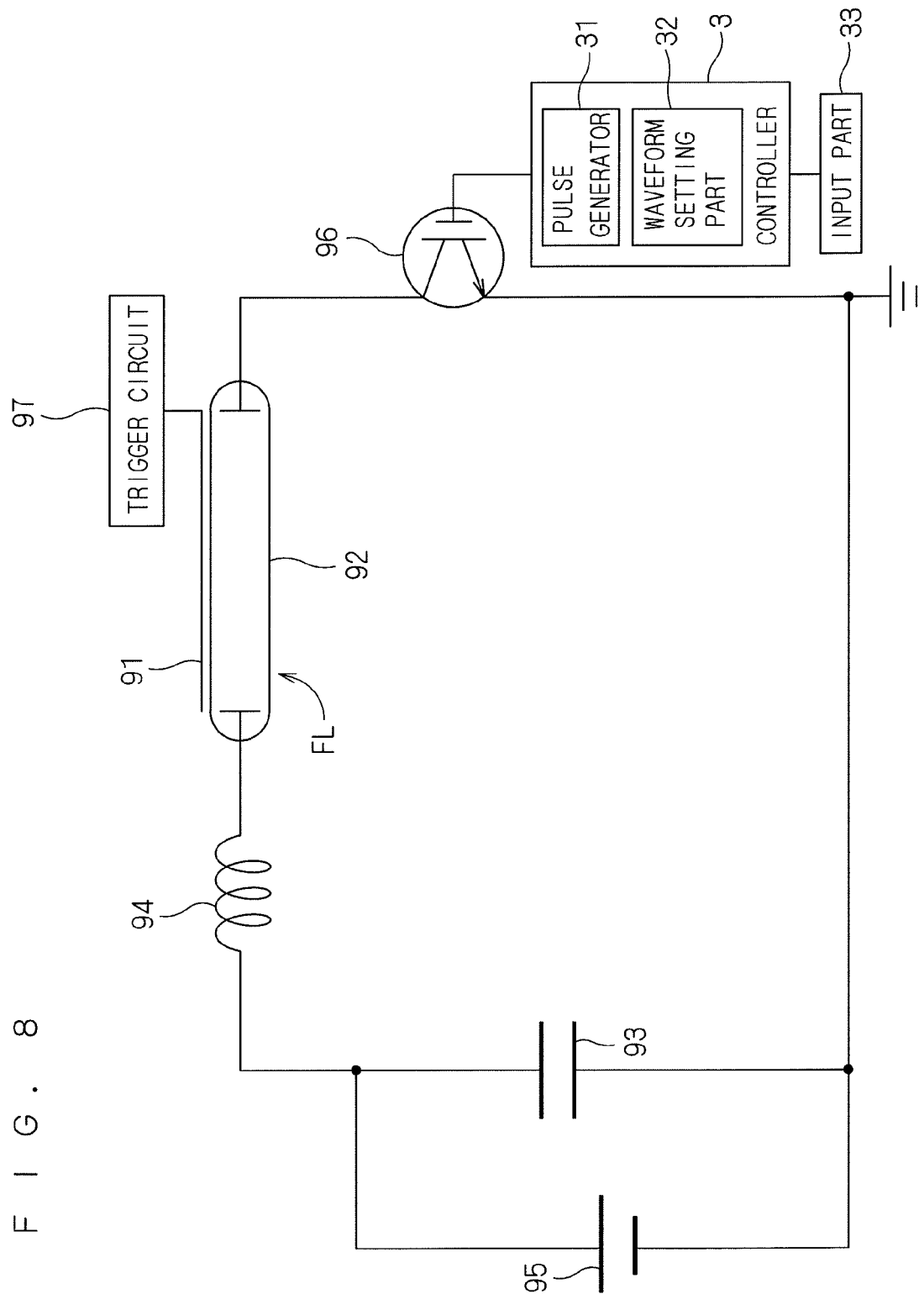
FIG. 8 is a diagram showing a driving circuit for a flash lamp.

FIG. 8 is a diagram showing a driving circuit for each flash lamp FL. As illustrated in FIG. 8, a capacitor 93, a coil 94, a flash lamp FL, and an IGBT (insulated-gate bipolar transistor) 96 are connected in series. Also as shown in FIG. 8, the controller 3 includes a pulse generator 31 and a waveform setting part 32, and is connected to an input part 33. Examples of the input part 33 used herein include various known input devices such as a keyboard, a mouse, and a touch panel. The waveform setting part 32 sets the waveform of a pulse signal, based on an input from the input part 33, and the pulse generator 31 generates the pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage (charging voltage). A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOSFET (metal-oxide-semiconductor field-effect transistor) incorporated in the gate thereof, and is also a switching element suitable for handling a large amount of power. The pulse generator 31 in the controller 3 applies the pulse signal to the gate of the IGBT 96. When a voltage ("high" voltage) not less than a predetermined level is applied to the gate of the IGBT 96, the IGBT 96 turns on. When a voltage ("low" voltage) less than the predetermined level is applied to the gate of the IGBT 96, the IGBT 96 turns off. In this manner, the driving circuit including the flash lamp FL is turned on and off by the IGBT 96. By turning the IGBT 96 on and off, a connection between the flash lamp FL and the capacitor 93 corresponding thereto is made and broken.

Even if, with the capacitor 93 in the charged state, the IGBT 96 turns on to apply a high voltage across the electrodes of the glass tube 92, no electricity will flow through the glass tube 92 in a normal state because the xenon gas is electrically insulative. However, when the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

Also, the reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting.

The multiple (in the present preferred embodiment, 40) halogen lamps HL are incorporated in the halogen heating part 4 provided under the chamber 6. The halogen lamps HL receives electric power supplied from an electric power supply circuit 45 to emit light, thereby directing the halogen light from under the chamber 6 through the lower chamber window 64 toward the heat treatment space 65. The supply of electric power from the electric power supply circuit 45 is controlled by the controller 3. FIG. 7 is a plan view showing an arrangement of the multiple halogen lamps HL. In the present preferred embodiment, 20 halogen lamps HL are arranged in an upper tier, and 20 halogen lamps HL are arranged in a lower tier. Each of the halogen lamps HL is a rod-shaped lamp having an elongated cylindrical shape. The 20 halogen lamps HL in the upper tier and the 20 halogen lamps HL in the lower tier are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL in the upper tier and the longitudinal direction of the halogen lamps HL in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

Also as shown in FIG. 1, the heat treatment apparatus 1 includes the shutter mechanism 2 provided alongside the halogen heating part 4 and the chamber 6. The shutter mechanism 2 includes a shutter plate 21, and a sliding drive mechanism 22. The shutter plate 21 is a plate opaque to halogen light (light from a halogen light source), and is made of titanium (Ti), for example. The sliding drive mechanism 22 causes the shutter plate 21 to slidably move in a horizontal direction, thereby bringing the shutter plate 21 into and out of a light shielding position lying between the halogen heating part 4 and the holder 7. When the sliding drive mechanism 22 moves the shutter plate 21 forward, the shutter plate 21 is inserted into the light shielding position (a position indicated by dash-double-dot lines in FIG. 1) lying between the chamber 6 and the halogen heating part 4 to provide isolation between the lower chamber window 64 and the plurality of halogen lamps HL. Thus, light directed from the plurality of halogen lamps HL toward the holder 7 in the heat treatment space 65 is intercepted. On the other hand, when the sliding drive mechanism 22 moves the shutter plate 21 backward, the shutter plate 21 is retracted from the light shielding position lying between the chamber 6 and the halogen heating part 4 to open the space lying under the lower chamber window 64.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed. Also, as shown in FIG. 8, the controller 3 includes the pulse generator 31 and the waveform setting part 32. As mentioned earlier, the waveform setting part 32 sets the waveform of the pulse signal, based on an input from the input part 33, and the pulse generator 31 outputs the pulse signal to the gate of the IGBT 96 in accordance with the waveform. Further, the controller 3 controls the opening and closing of each of the valves in the atmosphere forming mechanism 180 to adjust the atmosphere inside the chamber 6, and controls the electric power supply circuit 45 to control the emission of light from the halogen lamps HL.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Figure 9:
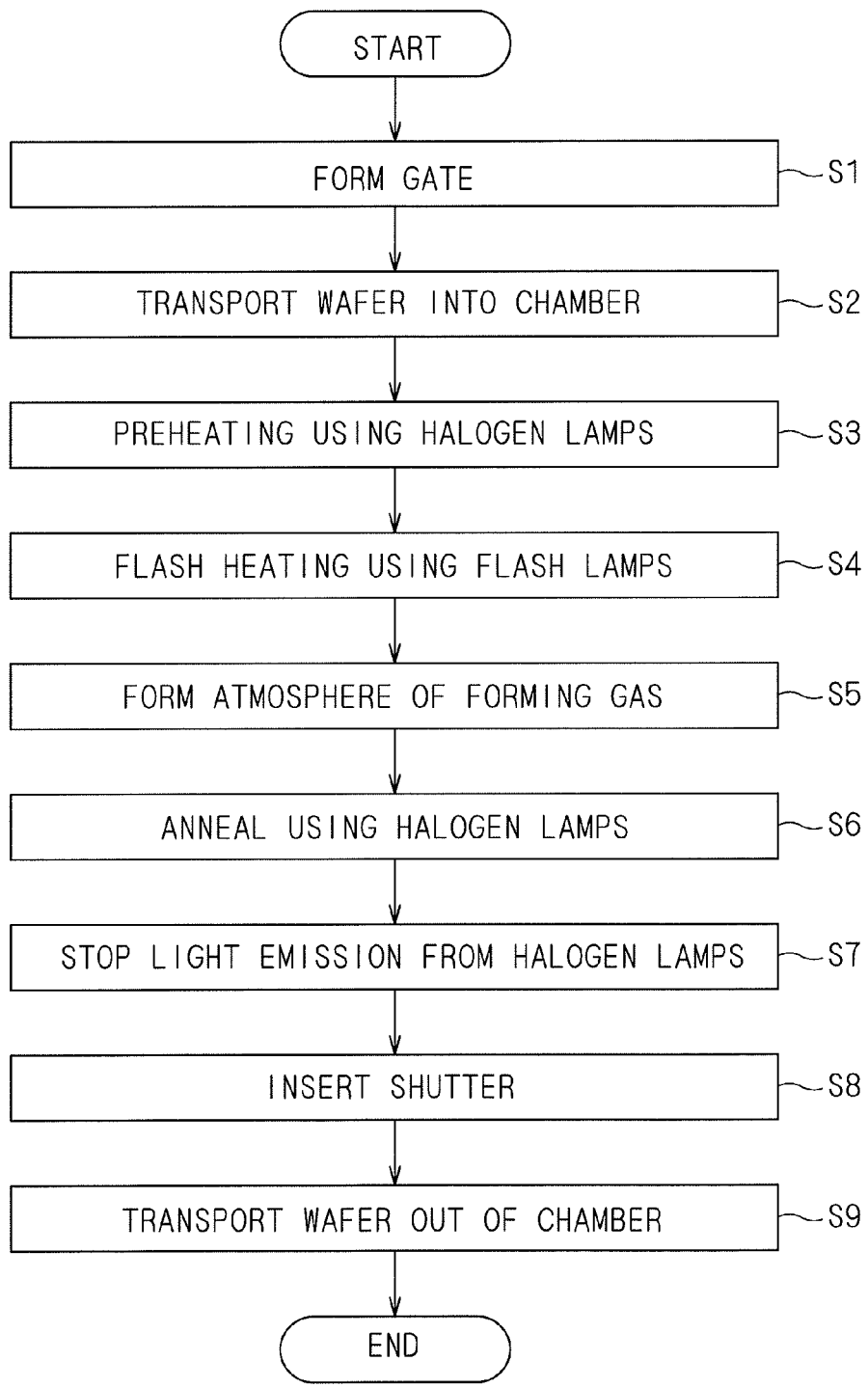
FIG. 9 is a flow diagram showing a procedure for treatment of a semiconductor wafer in the heat treatment apparatus of FIG. 1.

Next, a procedure for forming a gate of a high dielectric constant film on a semiconductor wafer W to perform a heat treatment on the semiconductor wafer W will be described. FIG. 9 is a flow diagram showing the procedure for the treatment of a semiconductor wafer W. Processes in Step S2 and its subsequent steps in FIG. 9 are those performed by the heat treatment apparatus 1.

Prior to the heat treatment, a gate structure including a high dielectric constant gate insulator film used for the semiconductor wafer W is formed (in Step S1). FIG. 10 is a view schematically showing the gate structure including a high dielectric constant film used as a gate insulator film.

A source 112 and a drain 113 are formed in a base material 111 of monocrystalline silicon (Si). A film 116 of silicon dioxide ($SiO_2$) is formed on part of the base material 111 lying between the source 112 and the drain 113, and a high dielectric constant film 117 is further formed on the film 116 of silicon dioxide. The high dielectric constant film 117 according to the present preferred embodiment includes at least one selected from the group consisting of TiN, ZrN, HfN, VN, NbN, TaN, MoN, WN, TiSiN, HfSiN, VSiN, NbSiN, TaSiN, MoSiN, WSiN, HfAlN, VAlN, NbAlN, TaAlN, MoAlN, and WAlN. The film 116 of silicon dioxide may be deposited by a thermal oxidation method, for example. The high dielectric constant film 117 may be deposited by MOCVD, for example. Alternatively, the high dielectric constant film 117 may be formed by ALD so that atomic layers are deposited one by one. The film 116 of silicon dioxide and the high dielectric constant film 117 serve as a gate insulator film.

Further, a gate electrode 118 is formed on the high dielectric constant film 117. The gate electrode 118 according to the present preferred embodiment is a metal gate electrode including at least one metal selected from the group consisting of titanium (Ti), zirconium (Zr), hafnium (Hf), vanadium (V), niobium (Nb), tantalum (Ta), molybdenum (Mo), and tungsten (W). The gate electrode 118 need not be the metal gate electrode, but may be made of polysilicon.

Side walls 119 made of SiN are formed on the opposite sides of the gate electrode 118. The side walls 119 may be formed before or after the gate electrode 118.

The semiconductor wafer W with such a gate structure formed thereon is transported into the aforementioned heat treatment apparatus 1 (in Step S2). The high dielectric constant film 117 just deposited without any post processing is low in crystallinity. It is hence necessary to heat the high dielectric constant film 117 to 1000° C. or higher, thereby promoting the crystallization of the high dielectric constant film 117. Also, interfaces between the high dielectric constant film 117 and the gate electrode 118 and between the high dielectric constant film 117 and the film 116 of silicon dioxide are not of good quality, but a large number of dangling bonds are present at the interfaces. The heat treatment in the heat treatment apparatus 1 according to the present preferred embodiment promotes the crystallization of the high dielectric constant film 117 after the deposition, and improves the quality of the interfaces. The procedure for the operation in the heat treatment apparatus 1 which will be described below proceeds under the control of the controller 3 over the operating mechanisms of the heat treatment apparatus 1.

Prior to the transport of the semiconductor wafer W into the heat treatment apparatus 1, the valve 183 for supply of nitrogen gas is opened, and the valves 89 and 192 for exhaust of gas are opened, so that the supply and exhaust of gas into and out of the chamber 6 are performed in the heat treatment apparatus 1. When the valve 183 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65. The gas within the chamber 6 is exhausted also through the transport opening 66 by opening the valve 192. Further, the exhaust mechanism not shown exhausts an atmosphere near the drivers of the transfer mechanism 10.

Subsequently, the gate valve 285 is opened to open the transport opening 66. A transport robot outside the heat treatment apparatus 1 transports the semiconductor wafer W with the high dielectric constant film 117 and the gate electrode 118 formed thereon through the transport opening 66 into the heat treatment space 65 of the chamber 6. At this time, nitrogen gas is continued to be supplied into the chamber 6 to minimize the atmosphere outside the heat treatment apparatus 1 flowing into the chamber 6. The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the susceptor 74 to receive the semiconductor wafer W.

After the semiconductor wafer W is placed on the lift pins 12, the transport robot moves out of the heat treatment space 65, and the gate valve 285 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude. The semiconductor wafer W is held on the susceptor 74 in such an attitude that a surface thereof where the gate electrode 118 and the high dielectric constant film 117 are formed is the upper surface. Also, the semiconductor wafer W is held inside the five guide pins 76 on the upper surface of the susceptor 74. The pair of transfer arms 11 moved downwardly below the susceptor 74 is moved back to the retracted position, i.e. to the inside of the recessed portion 62, by the horizontal movement mechanism 13.

After the semiconductor wafer W is placed and held on the susceptor 74 of the holder 7, the 40 halogen lamps HL in the halogen heating part 4 turn on simultaneously to start preheating (or assist-heating) (in Step S3). Halogen light emitted from the halogen lamps HL is transmitted through the lower chamber window 64 and the susceptor 74 both made of quartz, and impinges upon the back surface of the semiconductor wafer W. The back surface of the semiconductor wafer W refers to a main surface thereof on opposite side from the front surface with the high dielectric constant film 117 formed thereon, and generally has no device patterns formed thereon. The semiconductor wafer W is irradiated with the halogen light from the halogen lamps HL, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

FIG. 11 is a graph showing changes in the temperature of the front surface of the semiconductor wafer W. After the semiconductor wafer W is transported into the heat treatment space 65 and is placed on the susceptor 74, the controller 3 turns on the 40 halogen lamps HL at time t0 to increase the temperature of the semiconductor wafer W irradiated with the halogen light to a preheating temperature T1. The preheating temperature T1 is in the range of 600° to 900° C., and shall be 700° C. in the present preferred embodiment.

The temperature of the semiconductor wafer W is measured with the contact-type thermometer 130 when the halogen lamps HL perform the preheating. Specifically, the contact-type thermometer 130 incorporating a thermocouple comes through the notch 77 into contact with the lower surface of the semiconductor wafer W held by the susceptor 74 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches the predetermined preheating temperature T1 or not. In other words, the controller 3 effects feedback control of the electric power supply circuit 45 to adjust the intensity of the halogen lamps HL, based on the value measured with the contact-type thermometer 130, so that the temperature of the semiconductor wafer W is equal to the preheating temperature T1. It should be noted that, when the temperature of the semiconductor wafer W is increased by the irradiation with light from the halogen lamps HL, the temperature is not measured with the radiation thermometer 120. This is because the halogen light emitted from the halogen lamps HL enters the radiation thermometer 120 in the form of disturbance light to obstruct the precise measurement of the temperature.

After the temperature of the semiconductor wafer W reaches the preheating temperature T1, the controller 3 maintains the temperature of the semiconductor wafer W at the preheating temperature T1 for a short time. Specifically, at time t1 when the temperature of the semiconductor wafer W measured with the contact-type thermometer 130 reaches the preheating temperature T1, the controller 3 controls the electric power supply circuit 45 to adjust the intensity of the halogen lamps HL, thereby maintaining the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating. Further, the inner peripheral surface of the lower reflective ring 69 mounted to the chamber side portion 61 is provided as a mirror surface. Thus, a greater amount of light is reflected from the inner peripheral surface of the lower reflective ring 69 toward the peripheral portion of the semiconductor wafer W. This provides a more uniform in-plane temperature distribution of the semiconductor wafer W in the stage of preheating.

Next, the flash lamps FL emit a flash of light to perform a flash heating treatment (in Step S4) at time t2 when a predetermined time period has elapsed since the temperature of the semiconductor wafer W reached the preheating temperature T1. FIG. 12 is a graph showing changes in the temperature of the front surface of the semiconductor wafer W before and after the flash heating treatment, and shows part of the graph of FIG. 11 which is around the time t2 on an enlarged scale. It should be noted that a time period required for the temperature of the semiconductor wafer W at room temperature to reach the preheating temperature T1 (a time interval between the time t0 and the time t1) is only on the order of several seconds, and that a time period required between the instant at which the temperature of the semiconductor wafer W reaches the preheating temperature T1 and the instant at which the flash lamps FL emit a flash of light (a time interval between the time t1 and the time t2) is also only on the order of several seconds. For flash irradiation from a flash lamp FL, the capacitor 93 is charged in advance by the power supply unit 95. Then, with the capacitor 93 in the charged state, the pulse generator 31 in the controller 3 outputs a pulse signal to the IGBT 96 to drive the IGBT 96 on and off.

The waveform of the pulse signal is specified by inputting from the input part 33 a recipe that is a sequence of defined parameters including a time interval (ON time) equivalent to the pulse width and a time interval (OFF time) between pulses. After an operator inputs such a recipe from the input part 33 to the controller 3, the waveform setting part 32 in the controller 3 sets a pulse waveform having repeated ON and OFF time intervals in accordance with the recipe. Then, the pulse generator 31 outputs the pulse signal in accordance with the pulse waveform set by the waveform setting part 32. As a result, the pulse signal having the set waveform is applied to the gate of the IGBT 96 to control the driving on and off of the IGBT 96. Specifically, the IGBT 96 is on when the pulse signal inputted to the gate of the IGBT 96 is on, and the IGBT 96 is off when the pulse signal is off.

In synchronism with the turning on of the pulse signal outputted from the pulse generator 31, the controller 3 controls the trigger circuit 97 to apply a high voltage (trigger voltage) to the trigger electrode 91. The pulse signal is inputted to the gate of the IGBT 96, with the electrical charges stored in the capacitor 93, and the high voltage is applied to the trigger electrode 91 in synchronism with the turning on of the pulse signal, whereby a current flows across the electrodes of the glass tube 92 whenever the pulse signal is on. The resultant excitation of xenon atoms or molecules induces light emission.

The flash lamps FL start emitting light at time t21 in this manner, so that the front surface of the semiconductor wafer W held by the holder 7 is irradiated with a flash of light. If a flash lamp FL emits light without using the IGBT 96, the electrical charges stored in the capacitor 93 are consumed by the single light emission, so that the output waveform from the flash lamp FL exhibits a single pulse having a width on the order of 0.1 to 10 milliseconds. On the other hand, the IGBT 96 serving as a switching element is connected in the circuit and the pulse signal is outputted to the gate of the IGBT 96 according to the present preferred embodiment. Thus, the IGBT 96 intermittently supplies the electrical charges from the capacitor 93 to the flash lamp FL to control the current flowing to the flash lamp FL. As a result, the light emission from the flash lamp FL is accordingly chopper-controlled, which allows the electrical charges stored in the capacitor 93 to be consumed in a divided manner. This enables the flash lamp FL to repeatedly flash on and off in an extremely short time. It should be noted that, before the value of the current flowing in the circuit reaches exactly zero, the next pulse is applied to the gate of the IGBT 96 to increase the current value again. For this reason, the emission output never reaches exactly zero even while the flash lamp FL repeatedly flashes on and off. Thus, the IGBT 96 intermittently supplies the electrical charges to the flash lamp FL to freely determine the light emission pattern of the flash lamp FL, thereby freely adjusting the light emission time and the light emission intensity. The maximum light emission time of the flash lamp FL is not greater than one second.

By irradiating the front surface of the semiconductor wafer W with the high dielectric constant film 117 formed thereon with a flash of light from the flash lamps FL, the temperature of the front surface of the semiconductor wafer W including the gate electrode 118 and the high dielectric constant film 117 increases to a target temperature T2 (first temperature) at time t22. The light emission time of the flash lamps FL is as short as not greater than one second. The time required for the temperature of the front surface of the semiconductor wafer W to increase from the preheating temperature T1 to the target temperature T2 (a time interval between the time t21 and the time t22) is accordingly as extremely short as less than one second. The target temperature T2 is in the range of 1000° to 1200° C. where the crystallization of the high dielectric constant film 117 of the gate is promoted, and shall be 1100° C. in the present preferred embodiment.

Since the light emission time of the flash lamps FL is as short as not greater than one second, the time for which the high dielectric constant film 117 is heated near the target temperature T2 is accordingly extremely short. This suppresses the growth of the film 116 of silicon dioxide which results from the heating at an elevated temperature for a long time. It should be noted that the time required for the crystallization of the high dielectric constant film 117 is significantly short as compared with the diffusion time of oxygen. For this reason, the crystallization of the high dielectric constant film 117 is achieved even for a period of time that is too short to grow the film 116 of silicon dioxide.

After the flash irradiation using the flash lamp FL is completed, the IGBT 96 turns off to stop the light emission from the flash lamp FL. Then, the temperature of the front surface of the semiconductor wafer W decreases rapidly from the target temperature T2. At time t23, the temperature of the front surface of the semiconductor wafer W decreases to the preheating temperature T1. The irradiation of the semiconductor wafer W with light from the halogen lamps HL is continued before, during and after the flash irradiation. Thus, the temperature of the semiconductor wafer W is maintained at the preheating temperature T1 by the irradiation with light from the halogen lamps HL after the time t23.

In the present preferred embodiment, an atmosphere of a forming gas is formed within the chamber 6 (in Step S5) after the flash irradiation and before the decrease of the temperature of the front surface of the semiconductor wafer W to the preheating temperature T1. Specifically, the valve 187 is opened between the time t22 and the time t23. The valve 183 is open before the start of the preheating. Thus, the opening of the valve 187 causes a gas mixture (forming gas) of hydrogen gas and nitrogen gas to be supplied through the gas supply opening 81 into the heat treatment space 65. As a result, the atmosphere of the forming gas is formed around the semiconductor wafer W held by the holder 7 within the chamber 6. The concentration of hydrogen gas (i.e., the mixture ratio between hydrogen gas and nitrogen gas) in the atmosphere of the forming gas is determined by the flow regulating valve 181 and the flow regulating valve 186. In the present preferred embodiment, the flow regulating valve 186 and the flow regulating valve 181 regulate the flow rates of hydrogen gas and nitrogen gas so that the concentration of hydrogen gas in the atmosphere of the forming gas is approximately 4% by volume.

After the time t23, the temperature of the semiconductor wafer W is maintained at an annealing temperature T3 (second temperature) by the irradiation of the semiconductor wafer W with light from the halogen lamps HL (in Step S6). Specifically, the controller 3 effects feedback control of the electric power supply circuit 45 to adjust the intensity of the halogen lamps HL, based on the value measured with the contact-type thermometer 130, so that the temperature of the semiconductor wafer W is equal to the annealing temperature T3. In the present preferred embodiment, the preheating temperature T1 prior to the flash heating and the annealing temperature T3 after the flash heating are made equal to each other. Thus, the halogen lamps HL maintain the same irradiation intensity before and after the flash irradiation to allow a transition to the annealing process after the flash irradiation. This facilitates the control of the electric power supply circuit 45.

The annealing process using the halogen lamps HL is continuously performed from the time t23 to time t3 (with reference to FIG. 11). In other words, the temperature of the semiconductor wafer W is maintained at the annealing temperature T3 by the irradiation of the semiconductor wafer W with light from the halogen lamps HL from the time t23 to the time t3. During the execution of the annealing process using the halogen lamps HL, the atmosphere of the forming gas is continuously formed. Thus, the semiconductor wafer W after the flash heating is annealed in the atmosphere of the forming gas.

The temperature of the semiconductor wafer W is maintained at the annealing temperature T3 in the atmosphere of the forming gas containing hydrogen gas, so that dangling bonds of a high dielectric constant material present near the interfaces between the high dielectric constant film 117 and the gate electrode 118 and between the high dielectric constant film 117 and the film 116 of silicon dioxide are hydrogen-terminated. This eliminates defects present near the interfaces between the deposited high dielectric constant film 117 and the gate electrode 118 and between the deposited high dielectric constant film 117 and the film 116 of silicon dioxide to improve the interface characteristics of the high dielectric constant film 117.

The annealing temperature T3 preferable for such an annealing process is in the range of 300° to 700° C. In the present preferred embodiment, the annealing temperature T3 shall be 700° C. which is equal to the preheating temperature T1. It should be noted that the annealing temperature T3 is always lower than the target temperature T2. If the annealing temperature T3 is less than 300° C., the hydrogen termination does not readily proceed. If the annealing temperature T3 exceeds 700° C., there are apprehensions that the film 116 of silicon dioxide grows and that impurities are diffused when such impurities are implanted in the source 112 and the drain 113. For these reasons, the annealing temperature T3 shall be in the range of 300° to 700° C.

The annealing time for which the temperature of the semiconductor wafer W is maintained at the annealing temperature T3, i.e. the time interval between the time t23 and the time t3, is in the range of two seconds to 30 minutes. This annealing time depends on the annealing temperature T3. The higher the annealing temperature T3 is, the shorter the annealing time may be. For the aforementioned reason, the upper limit of the annealing temperature T3 shall be 700° C. When the annealing temperature T3 is equal to the upper limit of 700° C., the annealing time is required to be two seconds. On the other hand, when the annealing time exceeds 30 minutes, it takes long time for the annealing process of a single semiconductor wafer W, which results in the decrease in the throughput of the heat treatment apparatus 1. For these reasons, the annealing time shall be in the range of two seconds to 30 minutes.

The halogen lamps HL turn off at the time t3 when a predetermined annealing time period has elapsed (in Step S7). This causes the temperature of the semiconductor wafer W to start decreasing from the annealing temperature T3. At the time t3 when the annealing process is completed, only the valve 187 is closed to replace the atmosphere within the chamber 6 with a nitrogen gas atmosphere. At the same time that the halogen lamps HL turn off, the shutter mechanism 2 inserts the shutter plate 21 into the light shielding position lying between the halogen heating part 4 and the chamber 6 (in Step S8). The temperatures of filaments and tube walls of the halogen lamps HL do not decrease immediately after the halogen lamps HL turn off, but radiant heat is continuously emitted from the filaments and the tube walls at elevated temperature for a short time interval to obstruct the temperature decrease of the semiconductor wafer W. The insertion of the shutter plate 21 interrupts the radiant heat emitted from the halogen lamps HL immediately after the turning off toward the heat treatment space 65 to increase the rate at which the temperature of the semiconductor wafer W decreases.

At the time of the insertion of the shutter plate 21 into the light shielding position, the radiation thermometer 120 starts measuring the temperature. Specifically, the radiation thermometer 120 measures the intensity of infrared radiation emitted from the lower surface of the semiconductor wafer W held by the holder 7 through the opening 78 of the susceptor 74 to measure the temperature of the semiconductor wafer W which is on the decrease. The measured temperature of the semiconductor wafer W is transmitted to the controller 3.

Some radiant light is continuously emitted from the halogen lamps HL at elevated temperature immediately after the turning off. The radiation thermometer 120, however, measures the temperature of the semiconductor wafer W when the shutter plate 21 is inserted in the light shielding position. Thus, the radiant light directed from the halogen lamps HL toward the heat treatment space 65 of the chamber 6 is interrupted. This allows the radiation thermometer 120 to precisely measure the temperature of the semiconductor wafer W held by the susceptor 74 without being influenced by disturbance light.

The controller 3 monitors whether the temperature of the semiconductor wafer W measured with the radiation thermometer 120 is decreased to a predetermined temperature or not. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 285, and the transport robot outside the heat treatment apparatus 1 transports the semiconductor wafer W placed on the lift pins 12 to the outside (in Step S9). Thus, the heat treatment apparatus 1 completes the heating treatment of the semiconductor wafer W.

In the present preferred embodiment, a flash of light is directed from the flash lamps FL onto the front surface of the semiconductor wafer W with the high dielectric constant film 117 and the gate electrode 118 formed thereon to perform the flash heating of the front surface up to the target temperature T2 of 1000° C. or higher for a short period of time of not greater than one second. The flash heating of the high dielectric constant film 117 deposited by the MOCVD or ALD technique up to 1000° C. or higher for a short period of time promotes the crystallization of the high dielectric constant film 117 while suppressing the growth of the film 116 of silicon dioxide.

Also in the present preferred embodiment, the temperature of the semiconductor wafer W is maintained at the annealing temperature T3 by irradiating the semiconductor wafer W subjected to the flash heating with light from the halogen lamps HL. The annealing process after the flash heating is performed in the atmosphere of the gas mixture of hydrogen gas and nitrogen gas. The annealing process which maintains the temperature of the semiconductor wafer W at the annealing temperature T3 in the atmosphere of the forming gas containing hydrogen gas is performed, so that the defects present near the interfaces between the high dielectric constant film 117 and the gate electrode 118 and between the high dielectric constant film 117 and the film 116 of silicon dioxide are eliminated by hydrogen termination. This improves the interface characteristics of the high dielectric constant film 117. That is, the heat treatment apparatus 1 according to the present preferred embodiment performs the flash heating using the flash lamps FL on the semiconductor wafer W with the high dielectric constant film 117 formed thereon and thereafter performs the annealing process using the halogen lamps HL in the atmosphere of the forming gas containing hydrogen gas, so that the interface characteristics of the high dielectric constant film 117 are improved while the crystallization of the high dielectric constant film 117 is promoted. As a result, this increases the capacitance of the gate including the high dielectric constant film 117 and reduces leakage current, to increase the life of the product as a device.

Also, the annealing temperature T3 after the flash heating is made equal to the preheating temperature T1 before the flash heating. It is hence sufficient to maintain the intensity of the halogen lamps HL substantially constant before and after the flash irradiation. The control of the electric power supply circuit 45 is facilitated.

While the preferred embodiment according to the present invention has been described hereinabove, various modifications of the present invention in addition to those described above may be made without departing from the scope and spirit of the invention. For example, although the annealing process is performed in the atmosphere of the gas mixture of hydrogen gas and nitrogen gas in the aforementioned preferred embodiment, the atmosphere during the annealing process is not limited to this. As an example, any gas selected from the group consisting of ammonia ($NH_3$), hydrogen chloride (HCl), sulfur dioxide ($SO_2$), nitrous oxide ($N_2O$), and hydrogen sulfide ($H_2S$) may be used in place of hydrogen gas. Like hydrogen gas, these gaseous species are capable of eliminating the defects present near the interfaces of the high dielectric constant film 117 by termination. That is, the annealing process in which the temperature of the semiconductor wafer W is maintained at the annealing temperature T3 may be performed in an atmosphere containing any gas selected from the group consisting of hydrogen, ammonia, hydrogen chloride, sulfur dioxide, nitrous oxide, and hydrogen sulfide.

Hydrogen used in the present invention is not limited to what is called light hydrogen (H), but may include heavy hydrogen (D) and tritium (T). The annealing process performed on the semiconductor wafer W in an atmosphere containing a gas of heavy hydrogen or tritium satisfactorily eliminates the defects present near the interfaces of the high dielectric constant film 117.

The concentration of hydrogen gas in the hydrogen-nitrogen gas mixture is not limited to 4% by volume, but may take any appropriate value. Also, a forming gas prepared by previously mixing hydrogen gas and nitrogen gas at predetermined concentrations may be used.

In the aforementioned preferred embodiment, the atmosphere of the hydrogen-nitrogen gas mixture is formed inside the chamber 6 after the flash irradiation. However, the atmosphere of the gas mixture may be formed before the flash irradiation and after the start of supply of hydrogen gas into the chamber 6. That is, it is only necessary that the atmosphere of the hydrogen-nitrogen gas mixture is already formed at the time when the annealing process in which the temperature of the semiconductor wafer W is maintained at the annealing temperature T3 is started.

When the atmosphere of the hydrogen-nitrogen gas mixture is formed before the flash irradiation in the aforementioned preferred embodiment, the preheating process for heating the semiconductor wafer W to the preheating temperature T1 is the process similar in significance to the annealing process, so that the defects present near the interfaces of the high dielectric constant film 117 are eliminated by termination also during the preheating process. In other words, the annealing process for eliminating the defects is not limited to that performed after the flash heating, but may be performed before the flash heating. However, if the defects are eliminated by the termination before the flash heating, there is a danger that the effect of the termination is lost when the temperature of the front surface of the semiconductor wafer W subjected to the flash irradiation is increased to 1000° C. or higher. It is therefore preferable that the annealing process is performed after the flash heating as in the aforementioned preferred embodiment.

The annealing temperature T3 is equal to the preheating temperature T1 in the aforementioned preferred embodiment, but is not limited to this. The annealing temperature T3 may be a different temperature from the preheating temperature T1. FIG. 13 is a graph showing another example of changes in the temperature of the front surface of a semiconductor wafer W before and after the flash heating treatment. As in the aforementioned preferred embodiment, the semiconductor wafer W is preheated to the preheating temperature T1, and the flash lamps FL start the flash irradiation at the time t21. This causes the temperature of the front surface of the semiconductor wafer W to increase to the target temperature T2 at the time t22. Thereafter, when the light emission from the flash lamps FL is stopped, the temperature of the front surface of the semiconductor wafer W decreases from the target temperature T2 to reach the annealing temperature T3 at time t24.

The annealing temperature T3 in the example shown in FIG. 13 is lower than the preheating temperature T1. The time required for the temperature of the semiconductor wafer W to decrease (a time interval between the time t22 and the time t24) is accordingly longer than the time interval between the time t22 and the time t23 in the aforementioned preferred embodiment. It should be noted that the annealing temperature T3 of FIG. 13 is also in the range of 300° to 700° C. Then, the annealing process in which the temperature of the semiconductor wafer W is maintained at the annealing temperature T3 by the irradiation with light from the halogen lamps HL starts at the time t24. Prior to the start of the annealing process, the atmosphere of the hydrogen-nitrogen gas mixture is formed inside the chamber 6, as in the aforementioned preferred embodiment. The annealing time of the semiconductor wafer W is in the range of two seconds to 30 minutes. This also eliminates the defects present near the interfaces of the high dielectric constant film 117 to improve the interface characteristics, as in the aforementioned preferred embodiment. Contrary to the example of FIG. 13, the annealing temperature T3 may be higher than the preheating temperature T1.

Further, although the voltage is applied to the trigger electrode 91 in synchronism with the turning on of the pulse signal in the aforementioned preferred embodiment, the timing of the application of the trigger voltage is not limited to this. The trigger voltage may be applied at fixed time intervals independently of the waveform of the pulse signal. In a case where the pulse signal is short in time intervals or where the passage of current is started by a pulse while the value of the current caused to flow through the flash lamp FL by the preceding pulse is not less than a predetermined value, the current continues to flow through the flash lamp FL without interruption. In such a case, it is not necessary to apply the trigger voltage for each pulse. In other words, the timing of the application of the trigger voltage may be arbitrarily determined as long as the timing of the current flow through the flash lamp FL coincides with the turning on of the pulse signal.

Although the IGBT 96 is used as a switching element in the aforementioned preferred embodiment, another transistor capable of turning on and off the circuit in accordance with the signal level inputted to the gate thereof may be used in place of the IGBT 96. It is, however, preferable to use an IGBT and a GTO (gate turn-off) thyristor which are suitable for handling high power as a switching element because the emission of light from the flash lamps FL consumes considerably high power.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

Moreover, a substrate to be treated by the heat treatment apparatus according to the present invention is not limited to a semiconductor wafer, but may be a glass substrate for use in a flat panel display for a liquid crystal display apparatus and the like, and a substrate for a solar cell.

While the invention has been described in detail, the foregoing description is in all aspects illustrative and not restrictive. It is understood that numerous other modifications and variations can be devised without departing from the scope of the invention.

What is claimed is:

1. A method of irradiating a substrate with a high dielectric constant film formed thereon with light to heat the substrate, thereby promoting the crystallization of said high dielectric constant film, said method comprising the steps of:
   (a) irradiating a surface of the substrate with said high dielectric constant film formed thereon with a flash of light from a flash lamp to heat the surface of said substrate including said high dielectric constant film to a first temperature; and
   (b) irradiating said substrate with light from a halogen lamp to maintain the temperature of said substrate at a second temperature lower than said first temperature,
   said step (b) being performed in an atmosphere containing any gas selected from the group consisting of hydrogen, ammonia, hydrogen chloride, sulfur dioxide, nitrous oxide, and hydrogen sulfide.

2. The method according to claim 1, wherein
the temperature of said substrate is maintained at a temperature in the range of 300° to 700° C. for a time period in the range of two seconds to 30 minutes in said step (b).

3. The method according to claim 1, wherein
said step (b) is performed after said step (a).

4. The method according to claim 3, further comprising the step of
   (c) irradiating said substrate with light from said halogen lamp to heat the temperature of said substrate to said second temperature, said step (c) being performed before said step (a).

5. The method according to claim 1, wherein
a gate electrode including at least one metal selected from the group consisting of titanium, zirconium, hafnium, vanadium, niobium, tantalum, molybdenum, and tungsten is formed on said high dielectric constant film.

6. The method according to claim 1, wherein
said high dielectric constant film includes at least one selected from the group consisting of TiN, ZrN, HfN, VN, NbN, TaN, MoN, WN, TiSiN, HfSiN, VSiN, NbSiN, TaSiN, MoSiN, WSiN, HfAlN, VAlN, NbAlN, TaAlN, MoAlN, and WAlN.

* * * * *